United States Patent
Sumi et al.

(10) Patent No.: US 7,285,824 B2
(45) Date of Patent: Oct. 23, 2007

(54) SEMICONDUCTOR DEVICE HAVING A LATERAL DIODE STRUCTURE

(75) Inventors: Yasuto Sumi, Kawasaki (JP); Koichi Endo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 11/181,926

(22) Filed: Jul. 15, 2005

(65) Prior Publication Data

US 2006/0197192 A1 Sep. 7, 2006

(30) Foreign Application Priority Data

Mar. 7, 2005 (JP) .............................. 2005-062595

(51) Int. Cl.
*H01L 29/74* (2006.01)
*H01L 31/111* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ...................... 257/343; 257/122; 257/130
(58) Field of Classification Search ........ 257/335–367, 257/107–131
See application file for complete search history.

(56) References Cited

U.S. PATENT DOCUMENTS 5,654,574 A * 8/1997 Williams et al. ............. 257/355
6,489,653 B2 * 12/2002 Watanabe et al. ........... 257/343
2004/0211884 A1 * 10/2004 Fang et al. ............... 250/214.1

FOREIGN PATENT DOCUMENTS

JP  7-130865  5/1995

* cited by examiner

*Primary Examiner*—Cuong Nguyen
(74) *Attorney, Agent, or Firm*—Oblon, Spivak, McClelland, Maier & Neustadt, P.C.

(57) ABSTRACT

A semiconductor device comprises: a semiconductor layer of a first conductivity type; a first semiconductor region of a second conductivity type provided on the semiconductor layer, the first semiconductor region being one of an anode region and a cathode region; a second semiconductor region of the first conductivity type provided on the first semiconductor region, the second semiconductor region being the other of the anode region and the cathode region; and a semiconductor buried region of the second conductivity type provided between the semiconductor layer and the first semiconductor region. The semiconductor buried region has an aperture where the first semiconductor region is in contact with the semiconductor layer.

20 Claims, 15 Drawing Sheets

ical notation: $F_{(4, 25)}$...

SEMICONDUCTOR DEVICE HAVING A LATERAL DIODE STRUCTURE

CROSS-REFERENCE TO RELATED APPLICATIONS

This application is based upon and claims the benefit of priority from the prior Japanese Patent Application No. 2005-062595, filed on Mar. 7, 2005; the entire contents of which are incorporated herein by reference.

BACKGROUND OF THE INVENTION

This invention relates to a semiconductor device having a diode structure of FRD (Fast Recovery Diode) type, and more particularly to a fast semiconductor device having a lateral diode structure and improved switching characteristics (or recovery characteristics).

Some semiconductor integrated circuit devices for in-vehicle and small motor control applications require relatively high withstand voltage and fast switching rate. A typical diode provided in the semiconductor integrated circuit device meeting such requirements, called "lateral diode", has a structure including a p-type substrate on which an $n^+$-type buried layer and an $n^+$-type diffusion layer are formed and isolated from the substrate potential (e.g., Japanese Laid-Open Patent Application 2003-92414). In this example, a RESURF (REduced SURface Field) layer is provided at the edge of the cathode to alleviate the electric field and maintain the withstand voltage of the diode at a high level.

On the other hand, faster switching rate is also increasingly required. However, previous attempts to provide a lateral diode of a faster rate involve the following problems.

In a lateral diode having a junction of a $p^-$-layer and an $n^-$-layer, minority carriers (i.e., holes) have been accumulated in the $n^-$-layer when a bias voltage is about to be turned off from forward to reverse. Sweeping out the accumulated carriers from the anode electrode of the diode at the time of turn-off will deteriorate the switching characteristics (e.g., turn-off time) because current flows from the n—layer to the anode electrode until the carriers are completely swept out.

SUMMARY OF THE INVENTION

According to an aspect of the invention, there is provided a semiconductor device comprising:
a semiconductor layer of a first conductivity type;
a first semiconductor region of a second conductivity type provided on the semiconductor layer, the first semiconductor region being one of an anode region and a cathode region;
a second semiconductor region of the first conductivity type provided on the first semiconductor region, the second semiconductor region being the other of the anode region and the cathode region; and
a semiconductor buried region of the second conductivity type provided between the semiconductor layer and the first semiconductor region,
the semiconductor buried region having an aperture where the first semiconductor region is in contact with the semiconductor layer.

According to other aspect of the invention, there is provided a semiconductor device comprising:
a semiconductor layer of a first conductivity type;
a first semiconductor region of a second conductivity type provided on the semiconductor layer;

a second semiconductor region of the first conductivity type provided on the first semiconductor region;
a semiconductor buried region of the second conductivity type provided between the semiconductor layer and the first semiconductor region, the semiconductor buried region having an aperture;
a first main electrode connected to the first semiconductor region;
a second main electrode connected to the second semiconductor region; and
a common electrode connected to the semiconductor layer.

According to other aspect of the invention, there is provided a semiconductor device comprising:
a semiconductor layer of a first conductivity type;
a first semiconductor region of a second conductivity type provided selectively on the semiconductor layer;
a second semiconductor region of the first conductivity type provided selectively on the first semiconductor region;
a semiconductor buried region of the second conductivity type provided between the semiconductor layer and the first semiconductor region, the semiconductor buried region having an aperture;
a third semiconductor region of the second conductivity type provided on the semiconductor layer to surround the first semiconductor region and connected to the buried region;
a fourth semiconductor region of the first conductivity type provided selectively on the semiconductor layer;
a first main electrode provided on the third semiconductor region;
a second main electrode provided on the second semiconductor region; and
a common electrode provided on the fourth semiconductor region,
a diode structure being constituted by the first and second semiconductor regions, one of which serves as a cathode region and the other of which serves as an anode region, and
carriers accumulated in the first semiconductor region being allowed to pass through the aperture provided in the buried region of the second conductivity type and to be discharged through the semiconductor layer, the fourth semiconductor region, and the common electrode.

DETAILED DESCRIPTION OF THE INVENTION

Embodiments of the invention will now be described with reference to the drawings.

Figure 1:
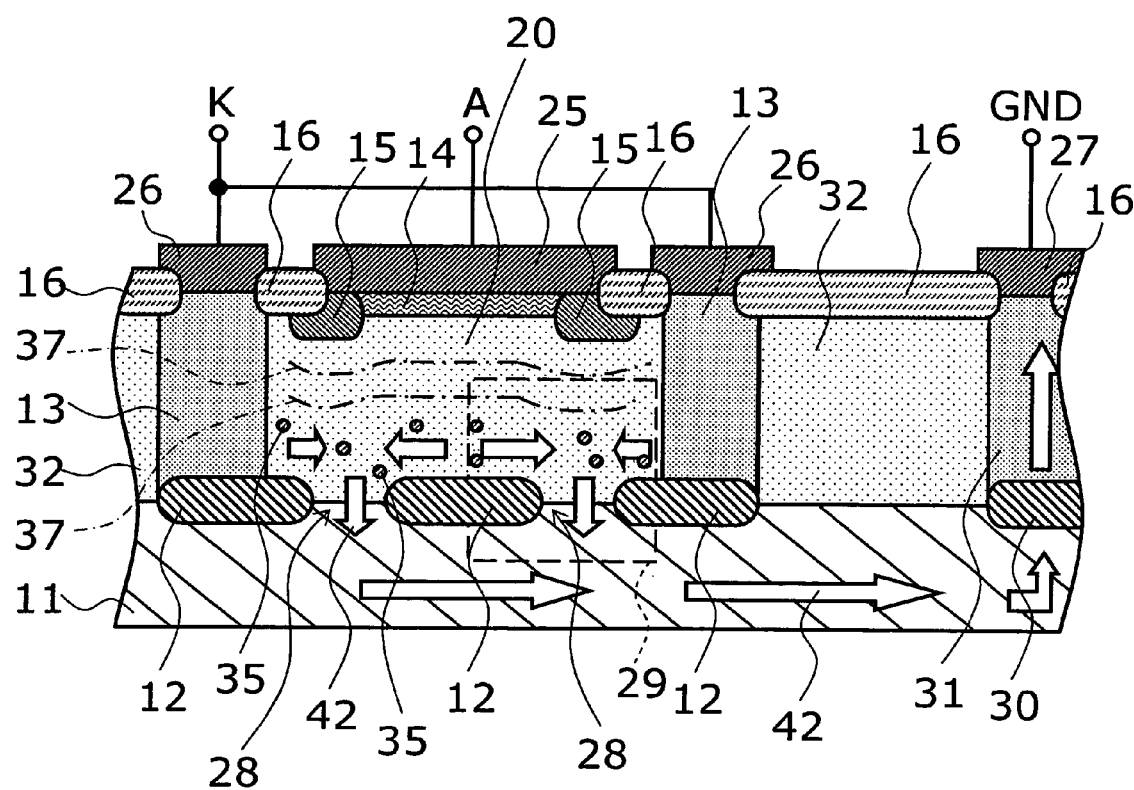
FIG. 1 is a schematic cross-sectional view of a semiconductor device of an example of the invention.

FIG. 1 is a cross-sectional view showing a relevant configuration of an FRD (Fast Recovery Diode) provided in a semiconductor device according to an embodiment of the invention.

More specifically, an $n^+$-buried layer 12 is provided in part on a $p^+$-type silicon substrate ($p^+$-layer) 11. An $n^-$-layer 20 is formed on the $n^+$-buried layer 12. Part of the $n^-$-layer 20 is isolated from another $n^-$-layer 32 by an $n^+$-diffusion layer 13. The $n^+$-buried layer 12, which is provided at the boundary with the p-type silicon substrate 11, has apertures 28. Thus the $n^-$-layer 20 is in contact with the p-type silicon substrate 11 through the apertures 28.

A $p^-$-layer 14 and a p-layer 15 covering the edge of the $p^-$-layer 14 are provided on the $n^-$-layer 20 to constitute an FRD. Here, the p-layer 15 serves as a guard ring for increasing the withstand voltage of p-n junction.

An anode electrode 25 is connected onto the $p^-$-layer 14 and p-layer 15 via apertures provided in an insulation film 16 (e.g., silicon oxide film). A cathode electrode 26 is provided on the $n^+$-diffusion layer 13 via apertures provided in the insulation film 16 (e.g., silicon oxide film).

Outside the region surrounded by the $n^+$-layer 13, a $p^+$-buried layer 30 is provided on the p-type silicon substrate 11, and the $p^+$-buried layer 30 is connected to a $p^+$-diffusion layer 31. The $p^+$-type diffusion layer 31 is connected in turn to a GND electrode 27 via apertures provided in the insulation film 16, thereby connected to the GND potential.

Here, the substrate 11 may be made of, for example, $p^+$-type silicon having a sheet resistance of about 9 to 15 Ω/cm. The $n^-$-layer 20 may be formed from, for example, silicon having a sheet resistance of about 2 to 5 Ω/cm. The $n^+$-buried layer 12 may be formed from, for example, silicon having a sheet resistance of about 10 to 20 Ω/cm and a thickness of about 3 to 6 micrometers.

The $p^-$-layer 14 may be formed by implanting boron (B) or the like into the surface of the $n^-$-layer 20 generally at an acceleration voltage of 40 keV and a dose of $1 \times 10^{13}$ to $7 \times 10^{13}$ cm$^{-2}$. When boron is implanted in this condition, the concentration near the surface is about $10^{18}$ cm$^{-3}$.

The p-layer 15 to serve as a guard ring may be formed by, for example, implanting p-type impurities to have a concentration of about $10^{20}$ cm$^{-3}$.

Figure 2:
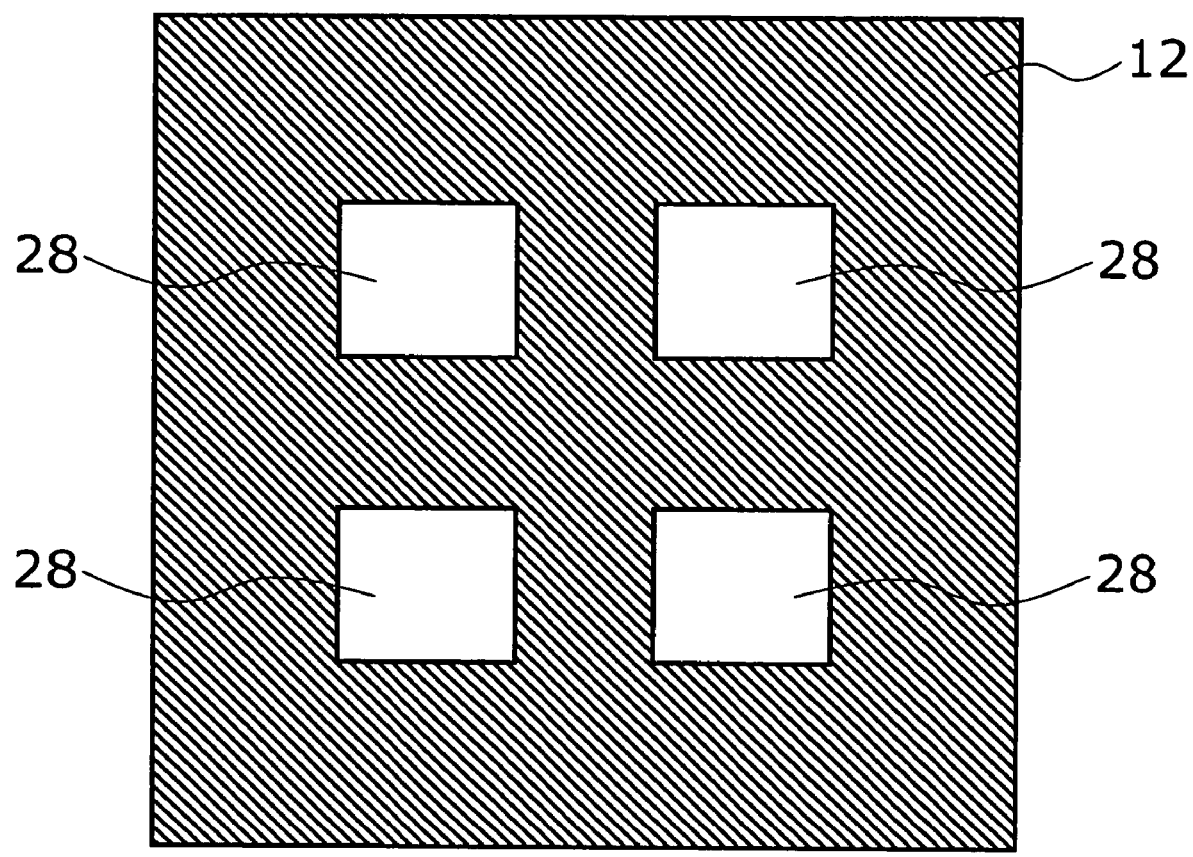
FIG. 2 is a schematic view illustrating an example planar pattern of a buried layer in the semiconductor device of the example of the invention shown in FIG. 1.

FIG. 2 is a schematic view illustrating a planar pattern of the $n^+$-buried layer 12 in the FRD according to the embodiment of the invention. More specifically, this figure shows a specific example where four apertures 28 are provided in the $n^+$-buried layer 12. As described later in detail, the shape of these apertures may have different variations. In addition, the width of the aperture is closely related to the FRD characteristics, as described later in detail.

Next, the operation of the semiconductor device of this embodiment will be described with reference to a comparative example.

Figure 3:
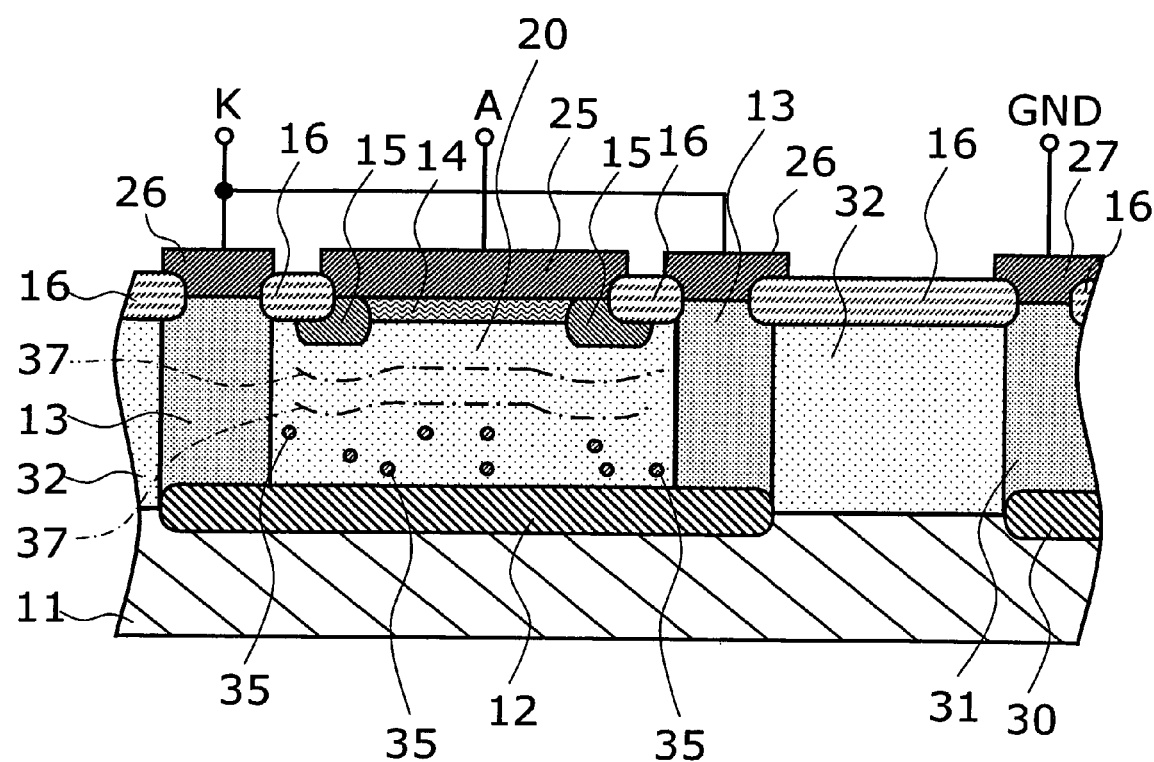
FIG. 3 is a schematic cross-sectional view of an FRD section in a semiconductor device of a comparative example investigated by the inventors in the course of reaching the invention.

FIG. 3 is a schematic view showing the cross-sectional structure of a semiconductor device of the comparative example investigated in the course of reaching the invention.

In this comparative example, no aperture 28 is formed in the $n^+$-buried layer 12. Therefore the diode section composed of the $n^-$-layer 20, $p^-$-layer 14, and p-layer 15 is isolated from the substrate potential by the $n^+$-layer 12 and $n^+$-diffusion layer 13.

In a lateral diode of this comparative example, minority carriers (holes 35 in this case) have been accumulated in the $n^-$-layer 20 when a bias voltage is about to be turned off from forward to reverse. In the structure of the comparative example illustrated in FIG. 3, the accumulated carriers (i.e., holes 35) are forced to return to the anode electrode 25 of the diode because the $n^-$-layer 20 is surrounded by the $n^+$-buried layer 12 and $n^+$-diffusion layer 13. Current flowing from the $n^-$-layer 20 to the anode electrode 25 until the accumulated carriers 35 are completely swept out will deteriorate the switching characteristics (e.g., turn-off time). That is, in this comparative example, the accumulated carriers at the time of turn-off have a discharge path only between the anode and the cathode of the FRD, which deteriorates the recovery characteristics.

In this respect, the inventors have recognized that a lateral diode in an integrated circuit device is not subjected to voltage below the potential of the p-type silicon substrate (GND). The inventors have thus found that any apertures 28 provided in the $n^+$-buried layer 12 as illustrated in FIGS. 1 and 2 would not produce unwanted current such as leak current through the apertures 28 in steady-state operation.

As illustrated in FIG. 1, when a reverse bias is applied to turn off the lateral diode, minority carriers accumulated in the $n^-$-layer 20 begin to be discharged. At this time, the depletion layer also begins to spread into the $n^-$-layer 20. In this embodiment, since apertures 28 are provided in the $n^+$-buried layer 12, the accumulated holes 35 are discharged outside not only via a path toward the anode, but also via another path from the apertures 28 in the $n^+$-buried layer through the p-type silicon substrate 11, $p^+$-buried layer 30, and $p^+$-diffusion layer 31 to the GND electrode 027. The latter path is illustrated by arrows in FIG. 1. As a result, the accumulated carriers 35 are quickly swept out, and thereby a lateral diode having superior switching characteristics (recovery characteristics) is achieved. In addition, advantageously, it can be expected that current through the path involving the anode or cathode is decreased because the hole current 42 is discharged also via a path through the p-type silicon substrate 11.

As described above, according to this embodiment, apertures 28 provided in the $n^+$-buried layer 12 serve to quickly sweep out accumulated carriers into the substrate 11 side, and thereby the recovery characteristics can be improved. The shape, size, and number of the apertures 28 may have different variations.

FIGS. 4 to 9 are schematic plan views showing specific examples of apertures 28.

Figure 4:
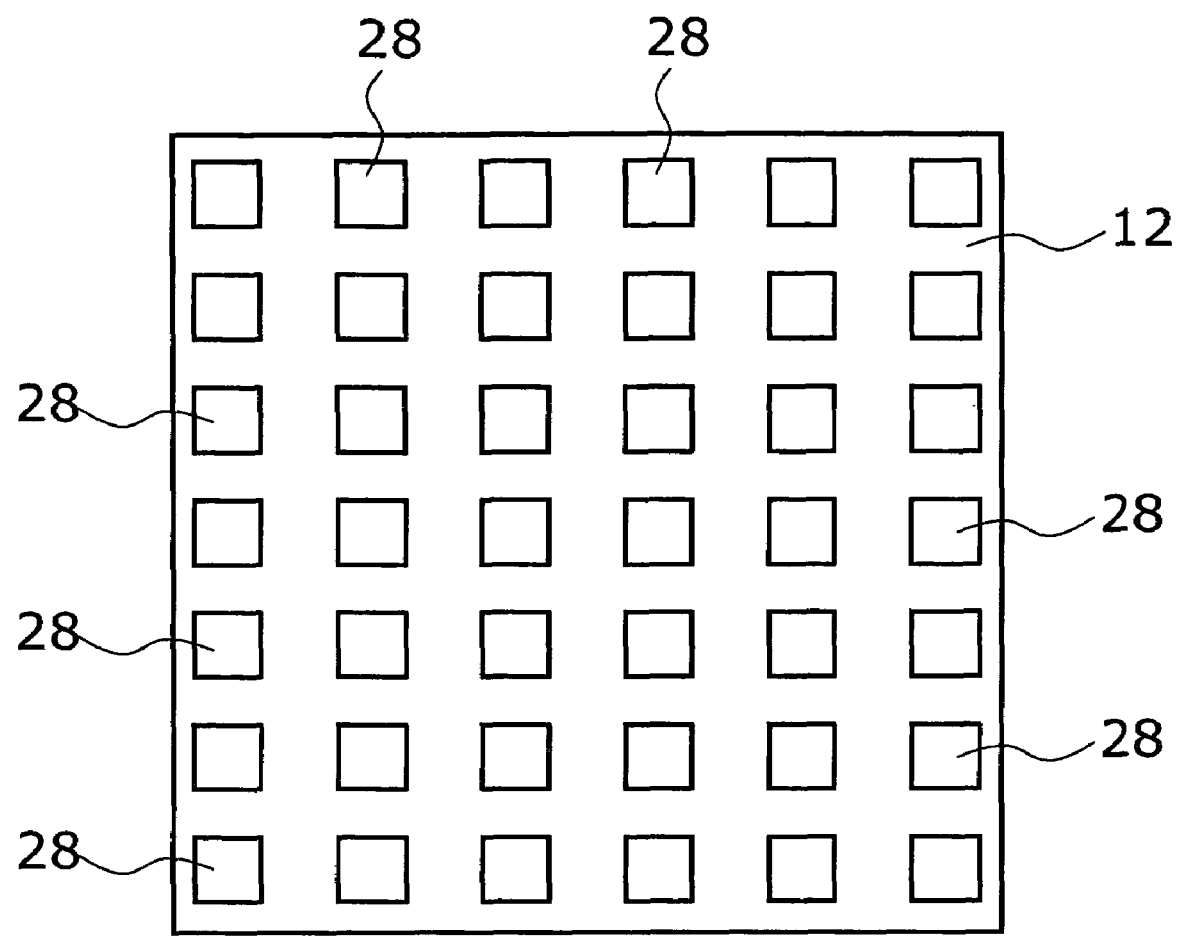
FIGS. 4 to 9 are schematic plan views showing specific examples of apertures 28.
Figure 5:
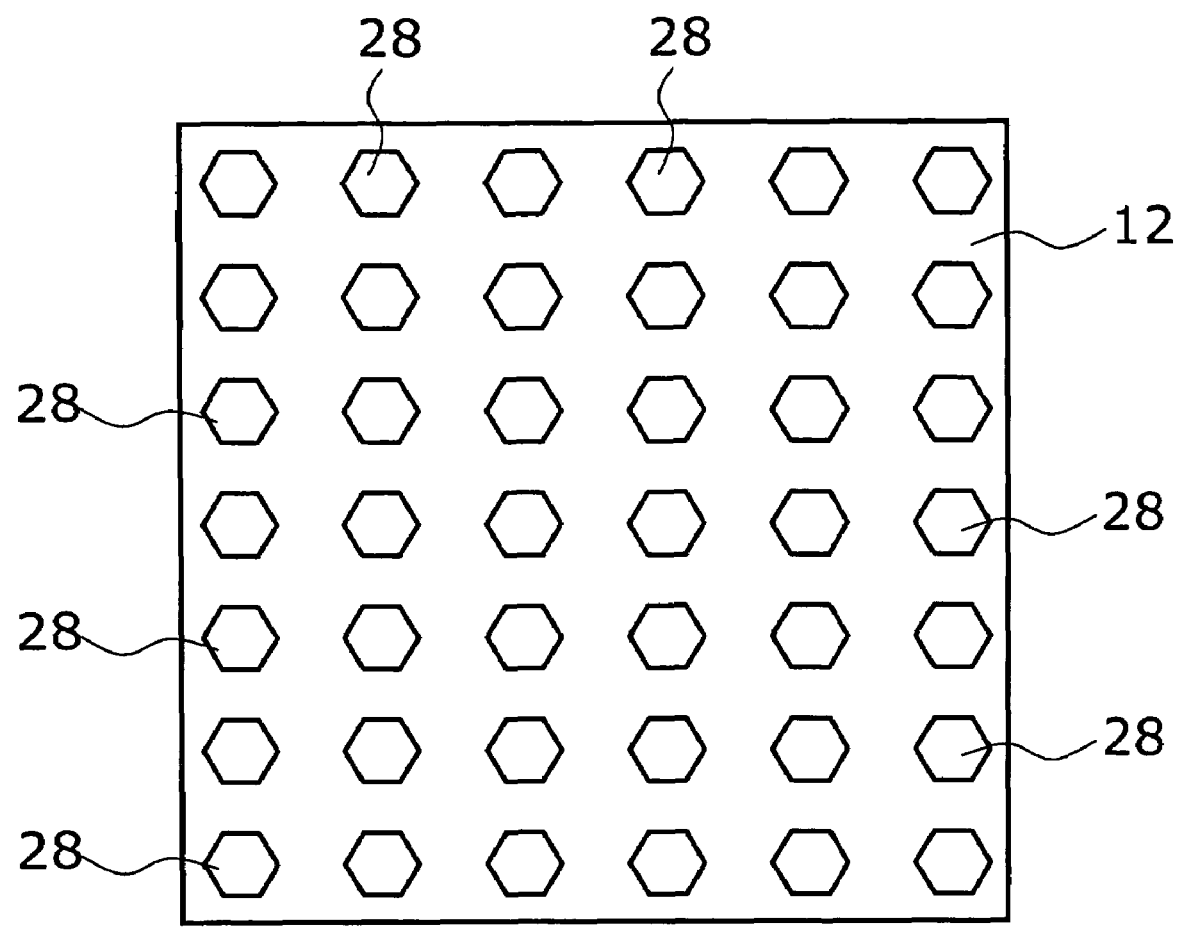
Figure 6:
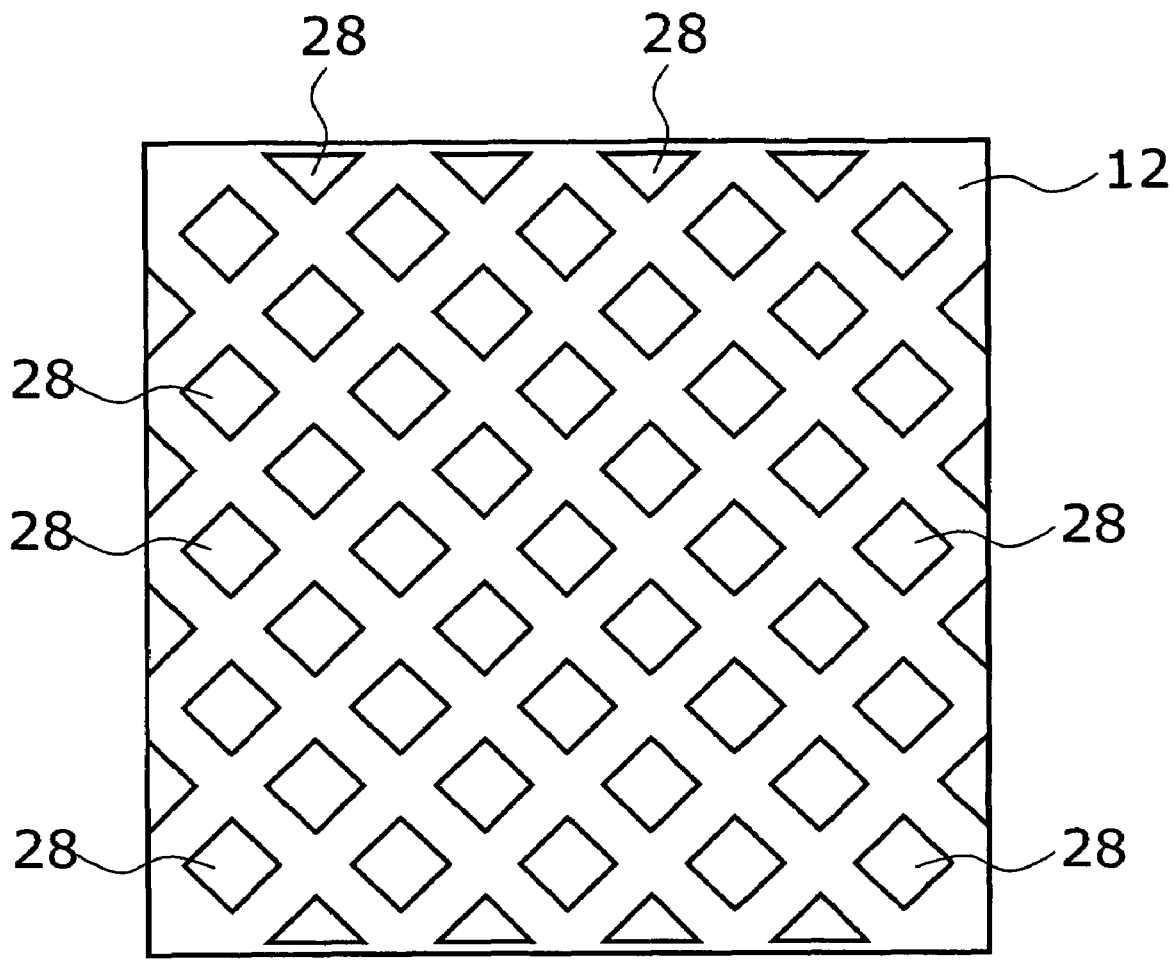
Figure 7:
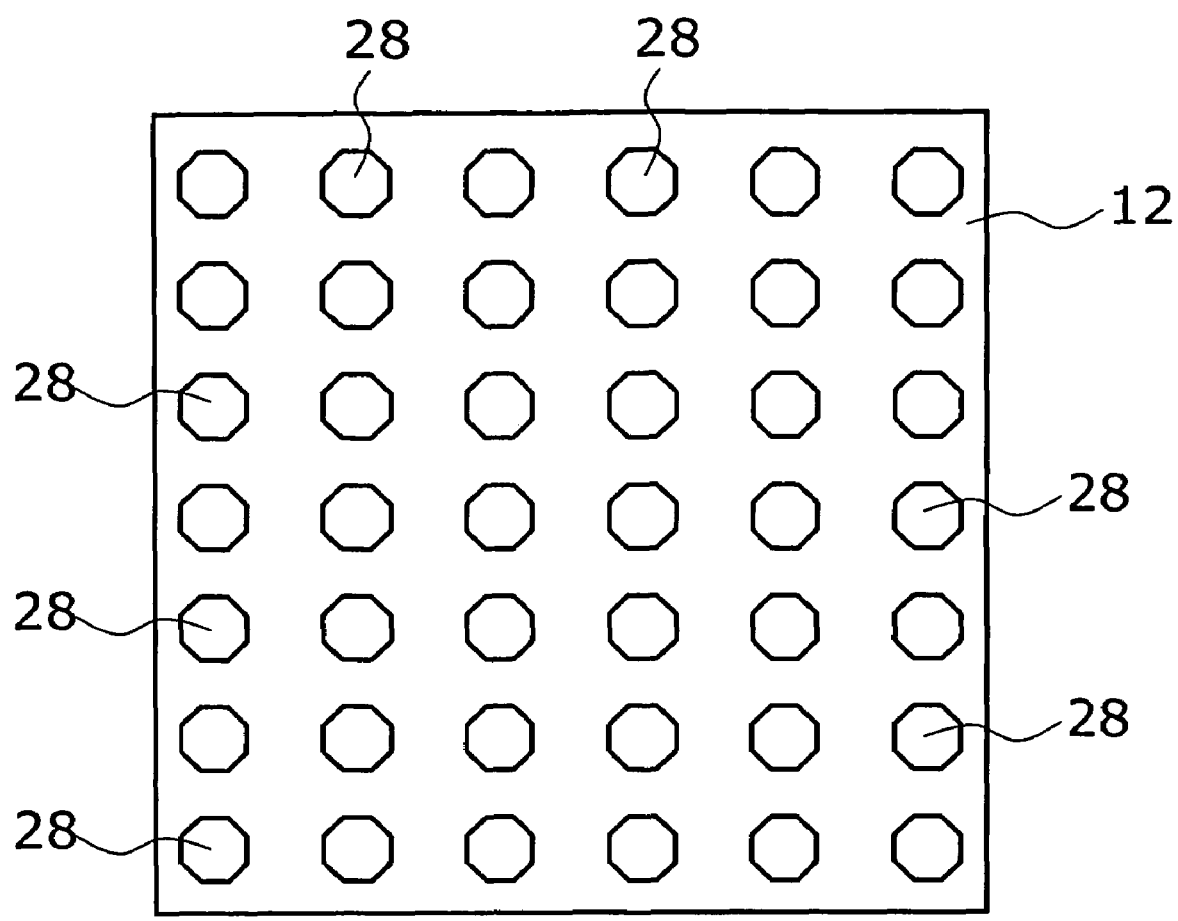
Figure 8:
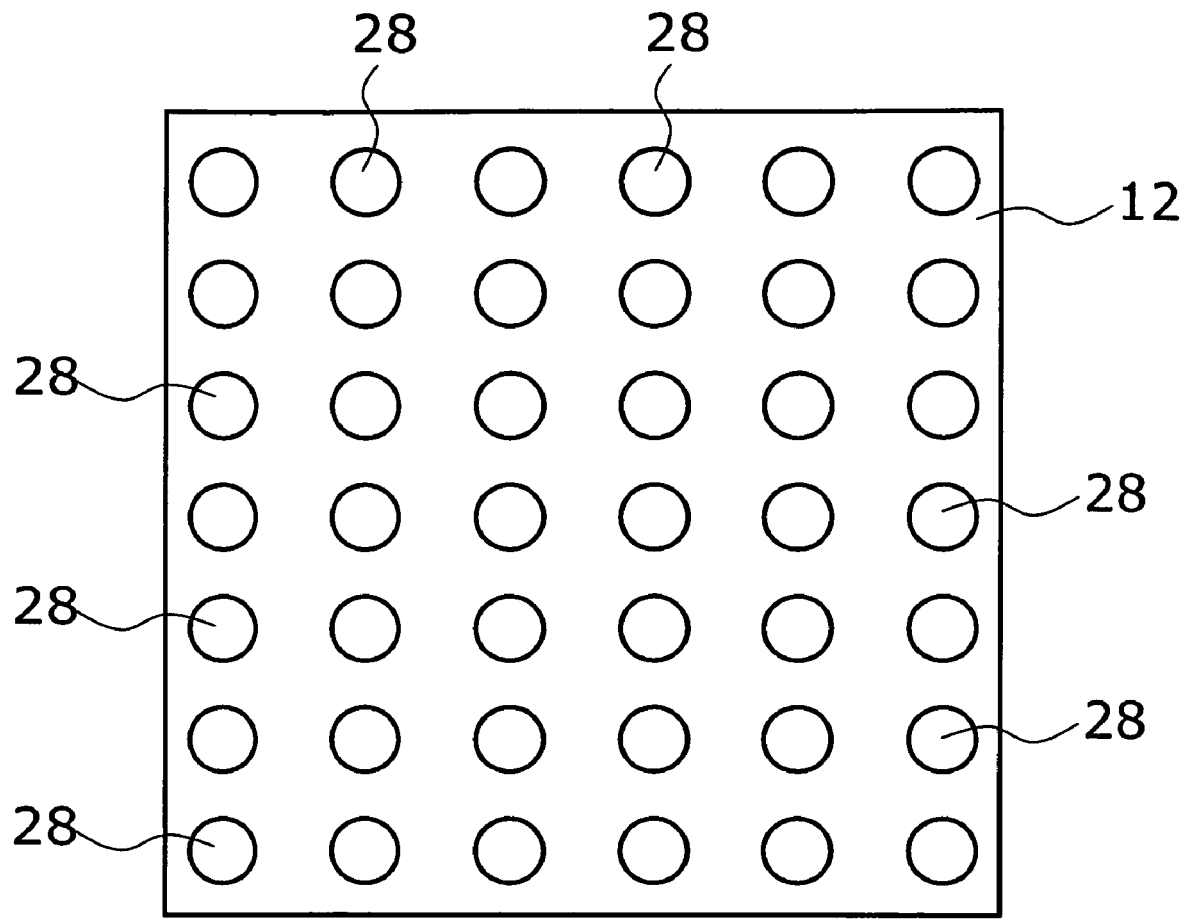

More specifically, the apertures 28 provided in the $n^+$-buried layer 12 may have a pattern of quadrangles uniformly arranged in a lattice configuration as illustrated in FIG. 4. The apertures 28 may have a pattern of hexagons as illustrated in FIG. 5, rhombi as illustrated in FIG. 6, octagons as illustrated in FIG. 7, or circles as illustrated in FIG. 8, located in a predetermined arrangement and pitch. Various other shapes such as triangles or other polygons and ellipses, for example, may be used for the aperture 28.

Figure 9:
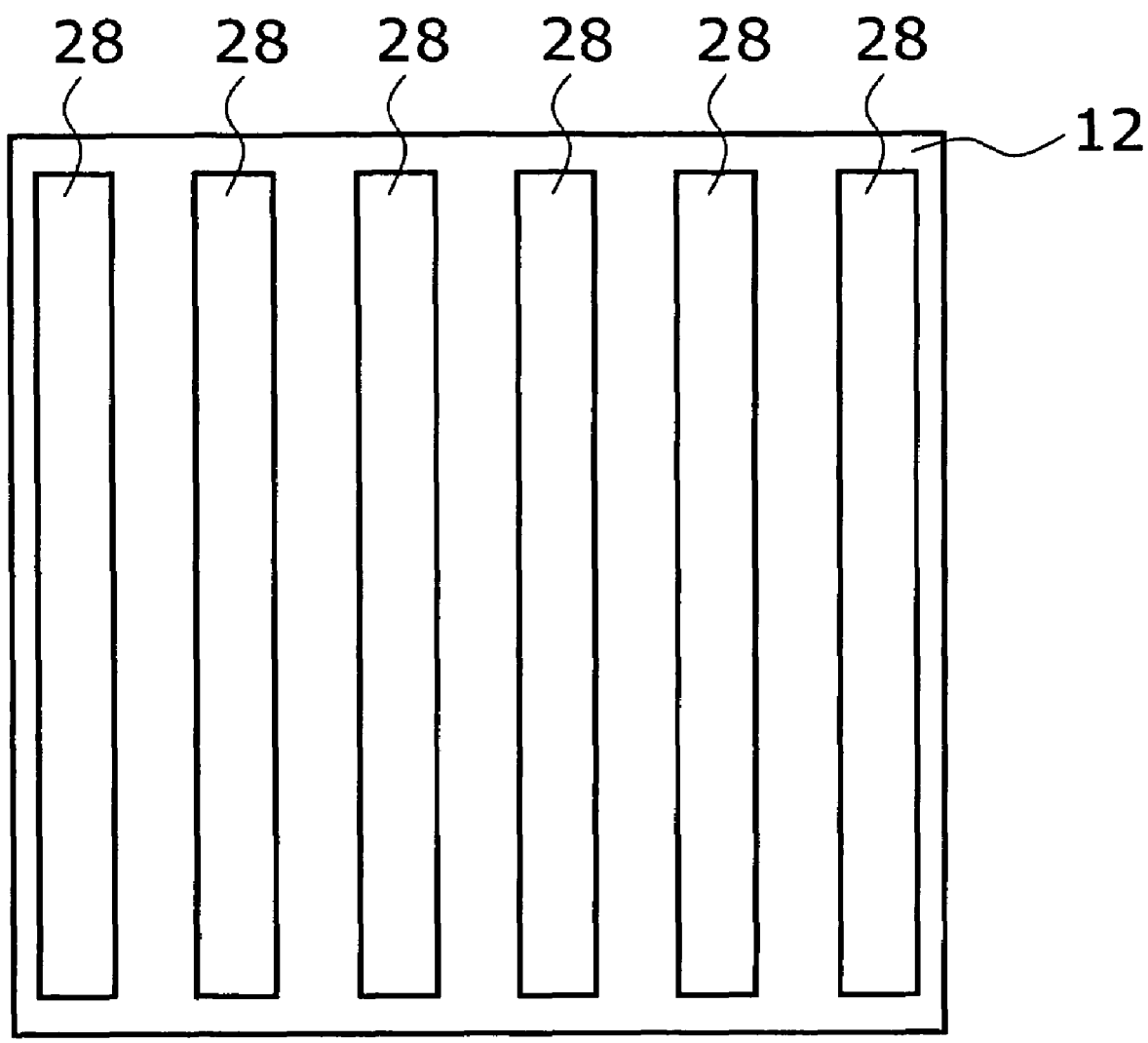

In addition, as illustrated in FIG. 9, apertures 28 generally shaped as stripes may be arranged in parallel at a predetermined pitch.

Next, the width W of the aperture 28 provided in the n$^+$-buried layer 12 and the device characteristics will be described in more detail.

Figure 10:
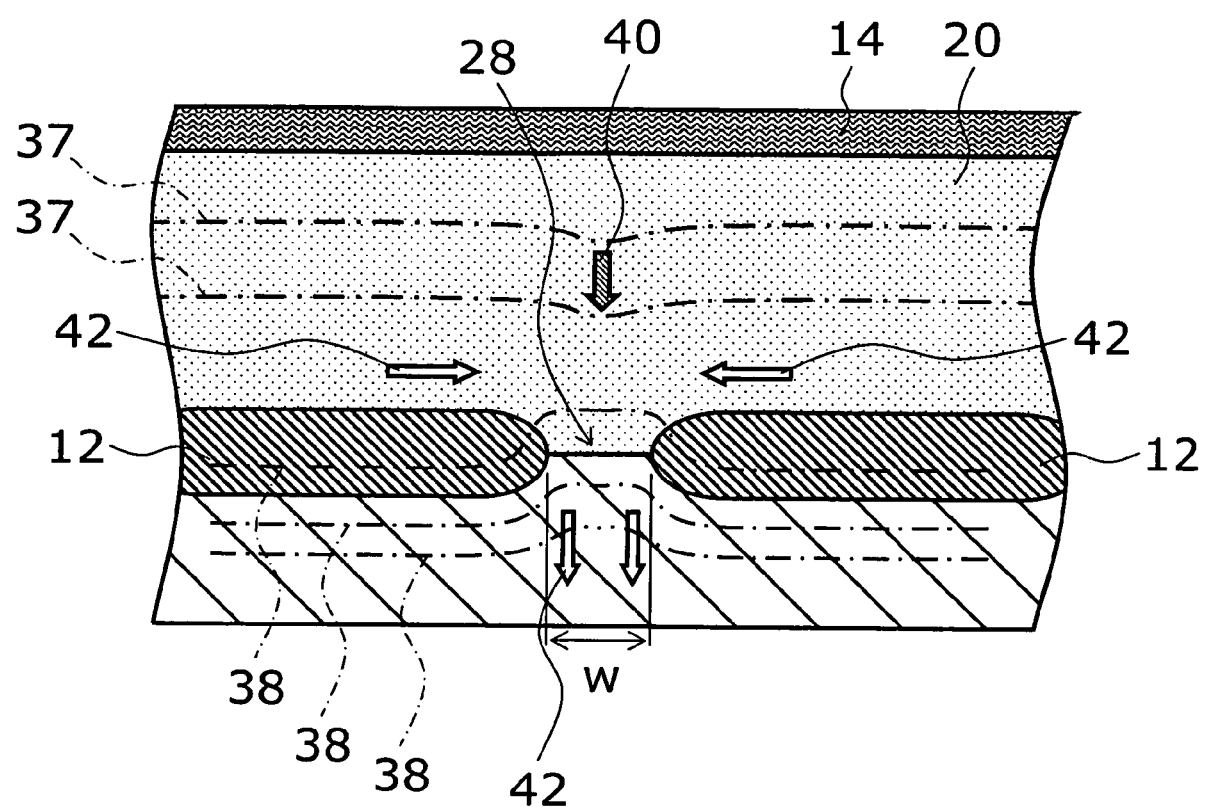
FIG. 10 is a schematic view showing a cross section of a relevant part of the buried layer 12 having a small aperture width W.

FIG. 10 is a schematic cross-sectional view illustrating a narrow aperture width W.

Figure 11:
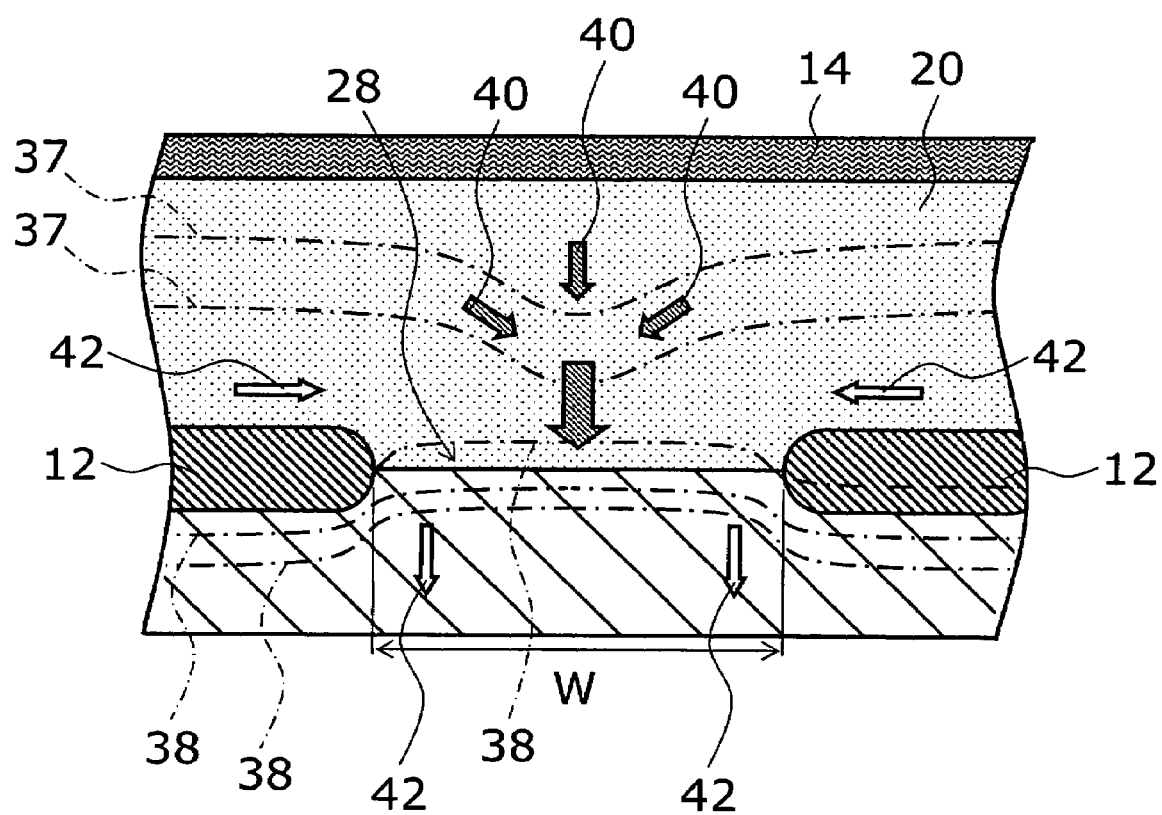
FIG. 11 is a schematic view showing a cross section of a relevant part of the buried layer 12 having a large aperture width W.

FIG. 11 is a schematic cross-sectional view illustrating a wide aperture width W.

For a narrow aperture width W (e.g., 1 to 5 micrometers), the n$^+$-buried layer 12 is depleted, and the depletion layers extending from both sides of the aperture are connected without substantial disturbance because the aperture is narrow. As a result, no substantial change occurs in the depletion layer 37 on the side near to the p$^-$-layer 14, which can suppress increase of leak current 40 at the p-n junction and maintain high withstand voltage. On the other hand, minority carriers (holes) accumulated in the n$^-$-layer 20 are passed through the aperture 28 to the p-type silicon substrate 11. Arrow 42 indicates this hole current. As a result, the switching rate is significantly improved.

Conversely, for a wide aperture width W (FIG. 11), the hole current 42 is significantly discharged to the p-type silicon substrate 11 side, which further improves the switching rate. However, the depletion layer 37 in the n$^-$-layer 20 is curved and protruded to the p-type silicon substrate side because of the wide aperture in the n$^+$-buried layer 12. Similarly, the depletion layer 38 spreading from the n$^+$-buried layer 12 is also curved and protruded to the n$^-$-layer 20 side. As a result, the leak current 40 increases and the p-n junction withstand voltage of the FRD decreases.

Figure 12:
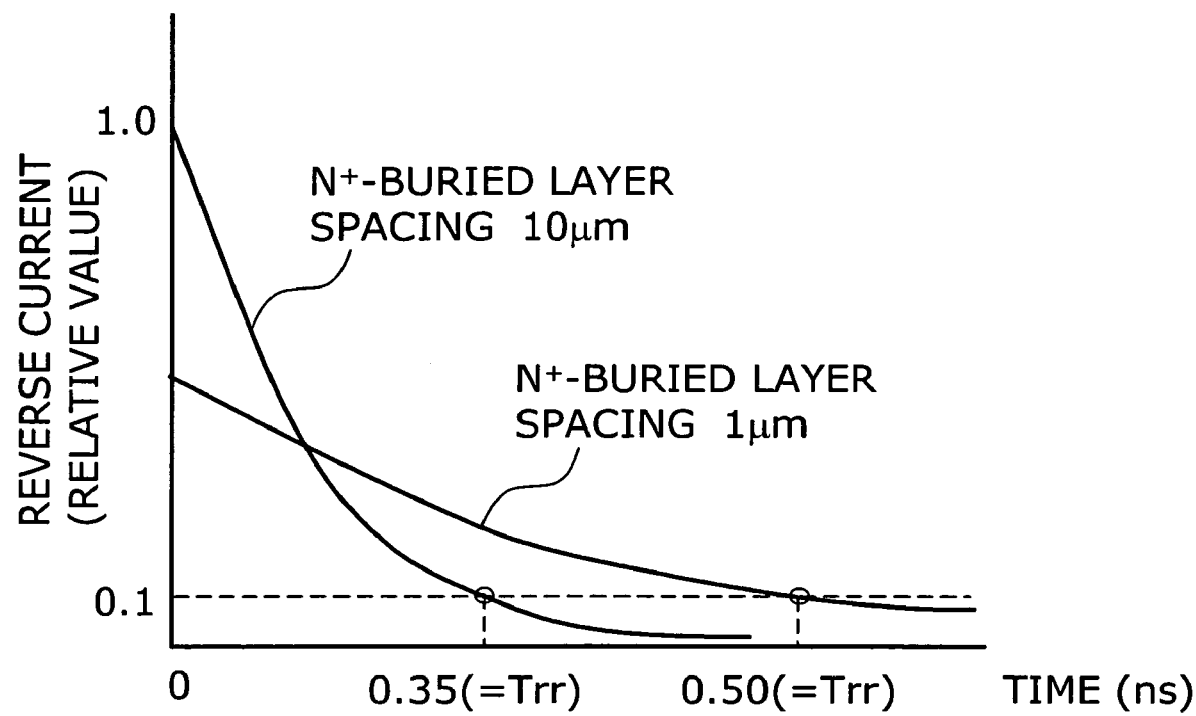
FIG. 12 is a graph illustrating the relationship between the aperture width of the buried layer and the switching characteristics of the invention.

FIG. 12 is a graph illustrating the temporal variation of reverse current when the aperture width W of the n$^+$-buried layer 12 is 1 and 10 micrometers.

The time Trr at which the reverse current falls below 10% of its initial value (relative value) is 0.35 nanosecond when the aperture width W of the buried layer is 10 micrometers, and 0.50 nanosecond when the aperture width W of the buried layer 12 is 1 micrometer. That is, as the aperture width W of the buried layer 12 increases, the switching rate is faster but the withstand voltage decreases. It turns out that a tradeoff exists between the withstand voltage and the switching characteristics.

Figure 13:
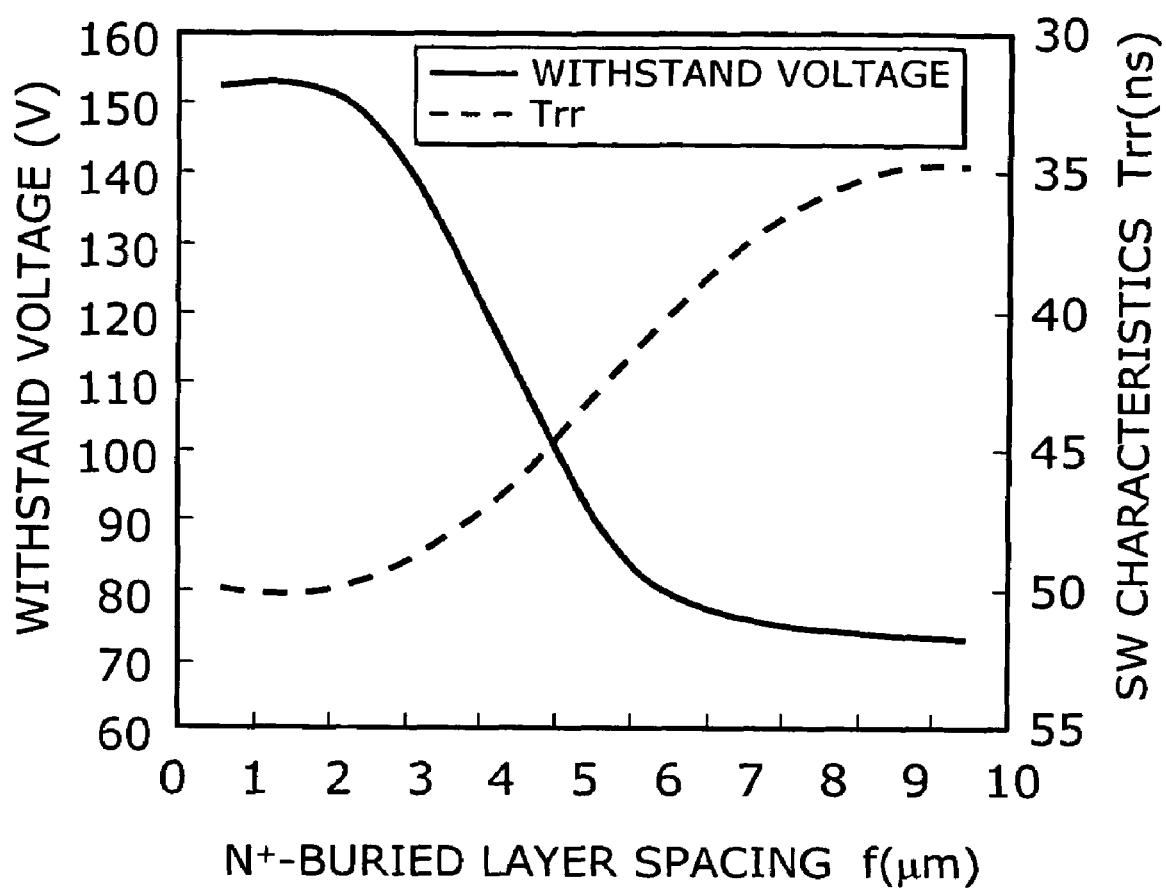
FIG. 13 is a graph for illustrating the presence of tradeoff between the aperture width of the buried layer and the withstand voltage, and between the aperture width of the buried layer and the switching characteristics of the invention.

FIG. 13 is a graph showing an example result obtained according to the invention. More specifically, this figure shows the relation of withstand voltage (solid line) and switching characteristics (reverse recovery time) Trr (dashed line) versus the aperture width W of the n$^+$-buried layer 12. As the aperture width W of the buried layer 12 increases from 0 to 10 micrometers, the withstand voltage decreases from 150 volts to about 80 volts. On the other hand, as the aperture width W of the buried layer 12 increases from 0 to 10 micrometers, the switching time Trr is improved from 50 to 35 nanoseconds.

More specifically, the switching time Trr begins to be improved when the aperture width W of the buried layer 12 exceeds 2 micrometers, is continually improved until the aperture width W reaches about 10 micrometers, and shows a tendency of saturation when the aperture width W exceeds 7 micrometers. Therefore, with respect to the switching time Trr, it may be desirable that the aperture width W of the buried layer 12 is about 2 micrometers or more.

The withstand voltage begins to decrease when the aperture width W of the buried layer 12 exceeds 2 micrometers, continually decreases until the aperture width W reaches about 7 micrometers, and shows a tendency of saturation when the aperture width W exceeds 7 micrometers. Therefore, with respect to the withstand voltage, it may be desirable that the aperture width W of the buried layer 12 is about 7 micrometers or less.

In other words, the aperture width W of the buried layer 12 within the range of 2 to 7 micrometers can achieve an effect of improving the switching characteristics while suppressing the decrease of withstand voltage to some extent. Moreover, for the aperture width W of the buried layer 12 within the range of 4 to 6 micrometers, the withstand voltage is made compatible with the switching characteristics in a balanced manner.

According to this embodiment, in view of this tradeoff, an optimal value for the aperture width W of the buried layer 12 can be selected to achieve a fast switching time within a range of withstand voltage permitted by user specification. The invention is not limited to the specific examples described above because optimal values for the dimension and semiconductor device characteristics may depend on the concentration and thickness of various semiconductor layers.

As described above in detail, this embodiment can offer a semiconductor device comprising a lateral diode having superior switching characteristics while maintaining the withstand voltage of the device at a high level.

Such a semiconductor device is suitable for making a switching regulator or DC-DC converter circuit in combination with CMOS (Complementary Metal-Oxide Semiconductor) transistors, for example.

Figure 14A:
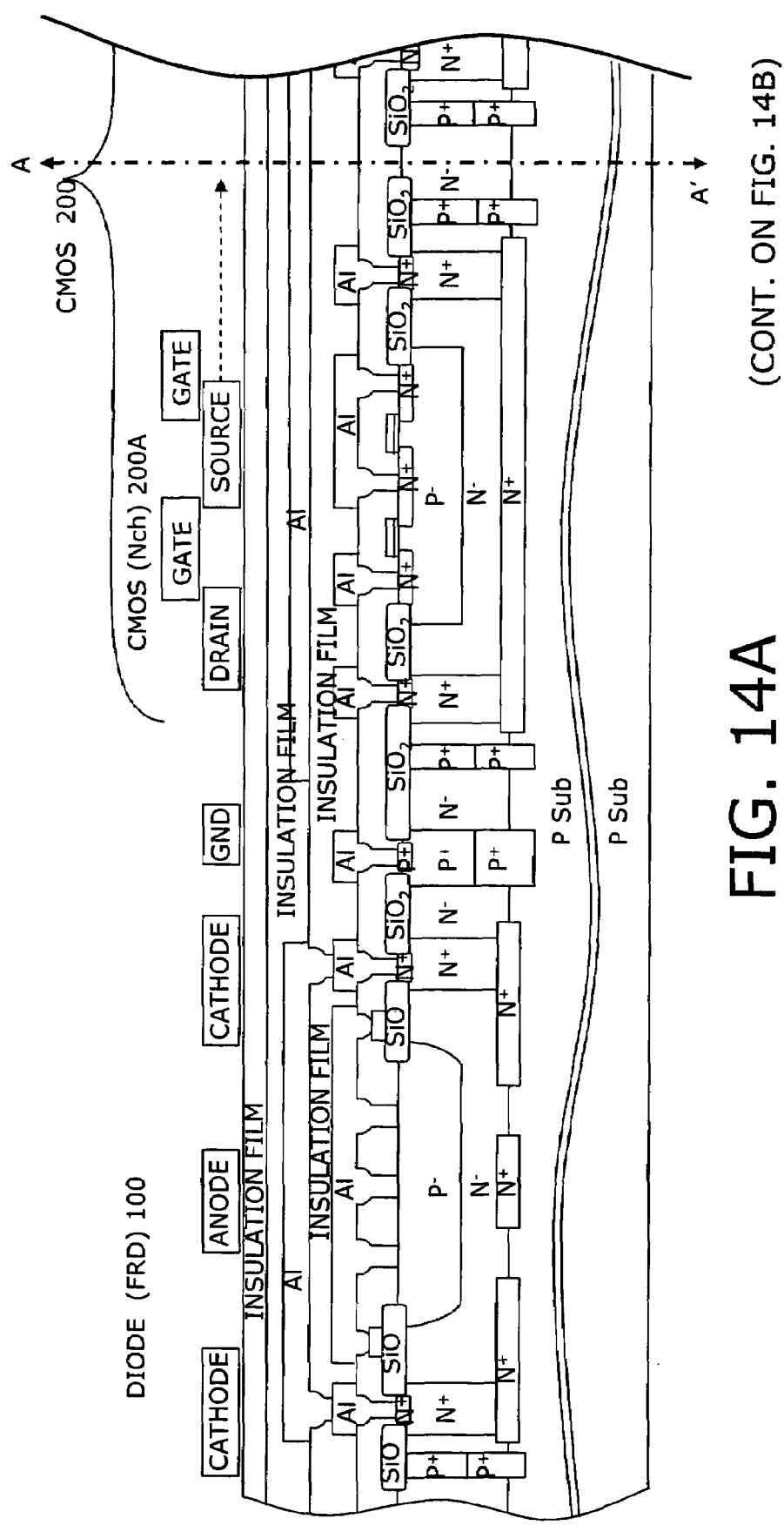
FIGS. 14A and 14B are cross-sectional views illustrating part of a semiconductor device in which the diode of the present embodiment is embedded.
Figure 14B:
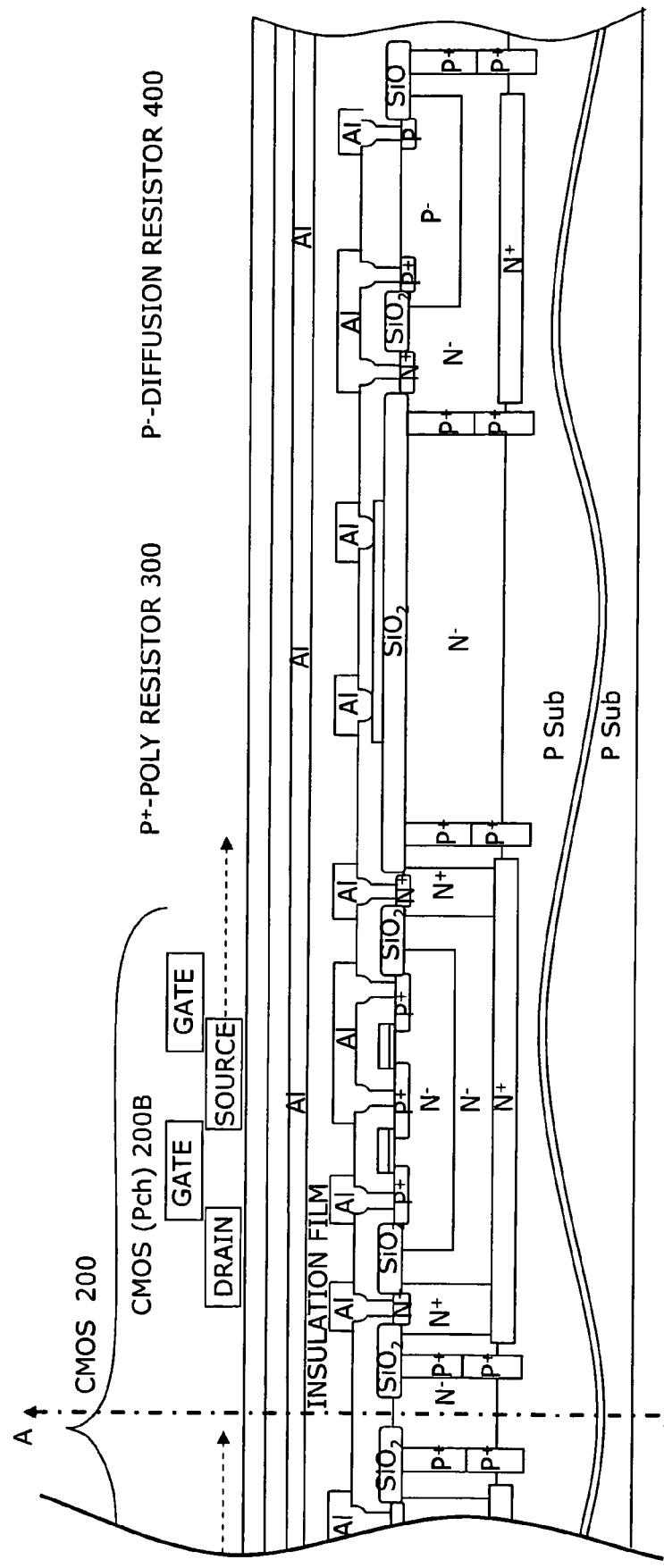

FIGS. 14A and 14B are cross-sectional views illustrating part of a semiconductor device in which the diode of the present embodiment is incorporated. In FIGS. 14A and 14B, part of the semiconductor device is divided into two portions. The left and right portions are shown in FIGS. 14A and 14B, respectively. In these figures, the dot-dashed line A-A' indicates an identical position in the semiconductor device.

More specifically, the semiconductor device is an integrated circuit device comprising a diode 100, an n-channel MOS transistor 200A constituting a CMOS 200, a p-channel MOS transistor 200B constituting the CMOS 200, a resistor 300 of p$^+$-type polysilicon, and a resistor 400 of p$^-$-diffusion region. The diode 100 has the features of the semiconductor device of the present embodiment described above with reference to FIGS. 1 to 13.

Such an integrated circuit device can be used as a switching regulator or DC-DC converter by being appropriately combined with additional inductors (not shown) and the like, for example. Moreover, according to this embodiment, the reverse recovery characteristics and the switching rate can be improved while maintaining the withstand voltage of the diode 100 at a high level. This enables highly efficient switching and voltage conversion with a small loss.

Embodiments of the invention have been described with reference to specific examples. However, the invention is not limited to the specific examples.

For example, with respect to dimensions, materials, and the like of the elements constituting the lateral diode, any choice from known ranges and its appropriate modification by those skilled in the art are also encompassed within the scope of the invention.

Furthermore, advantageous effects of the invention are also achieved by a lateral diode having a structure with the conductivity type of each element being reversed, which is encompassed within the scope of the invention.

As described above in detail, this invention can offer a semiconductor device comprising a lateral diode having superior switching characteristics while maintaining the withstand voltage of the device at a high level.

The invention claimed is:

1. A semiconductor device comprising:
a semiconductor layer of a first conductivity type;
a first semiconductor region of a second conductivity type provided on the semiconductor layer, the first semiconductor region being one of an anode region and a cathode region;
a second semiconductor region of the first conductivity type provided on the first semiconductor region, the second semiconductor region being the other of the anode region and the cathode region;
a semiconductor buried region of the second conductivity type provided between the semiconductor layer and the first semiconductor region;
a third semiconductor region of the second conductivity type provided on the semiconductor layer to adjoin the first semiconductor region and connected to the buried region;
a first main electrode connected to the third semiconductor region;
a second main electrode connected to the second semiconductor region; and
a common electrode connected to the semiconductor layer,
the semiconductor buried region having an aperture where the first semiconductor region is in contact with the semiconductor layer, the aperture being surrounded by the semiconductor buried region of the second conductivity type.

2. A semiconductor device according to claim 1, wherein carriers accumulated in the first semiconductor region are allowed to pass through the aperture provided in the buried region of the second conductivity type and to be discharged through the semiconductor layer.

3. A semiconductor device according to claim 2, wherein the discharge of the carriers is developed when a bias voltage applied to a diode which is formed between the first and second semiconductor regions is turned off from forward to reverse.

4. A semiconductor device according to claim 1, wherein the first semiconductor region is of n-type and the second semiconductor region is of p-type.

5. A semiconductor device according to claim 1, wherein the aperture has a width between 2 and 7 micrometers.

6. A semiconductor device according to claim 1, wherein the semiconductor layer is made of p-type silicon, the first semiconductor region is made of n-type silicon, the second semiconductor region is of p-type silicon and the semiconductor buried region is made of n-type silicon.

7. A semiconductor device according to claim 1, further comprising CMOS transistors formed on the semiconductor layer of the first conductivity type,
the semiconductor device being able to perform a switching action.

8. A semiconductor device comprising:
a semiconductor layer of a first conductivity type;
a first semiconductor region of a second conductivity type provided on the semiconductor layer;
a second semiconductor region of the first conductivity type provided on the first semiconductor region;
a semiconductor buried region of the second conductivity type provided between the semiconductor layer and the first semiconductor region, the semiconductor buried region having an aperture where the first semiconductor region is in contact with the semiconductor layer;
a third semiconductor region of the second conductivity type provided on the semiconductor layer to surround the first semiconductor region and connected to the buried region;
a first main electrode connected to the third semiconductor region;
a second main electrode connected to the second semiconductor region; and
a common electrode connected to the semiconductor layer,
a diode structure being constituted by the first and second semiconductor regions, one of which serves as a cathode region and the other of which serves as an anode region.

9. A semiconductor device according to claim 8, wherein carriers accumulated in the first semiconductor region are allowed to pass through the aperture provided in the buried region of the second conductivity type and to be discharged through the semiconductor layer and the common electrode.

10. A semiconductor device according to claim 9, wherein the discharge of the carriers is developed when a bias voltage applied to a diode which is formed between the first and second semiconductor regions is turned off from forward to reverse.

11. A semiconductor device according to claim 8, wherein the first semiconductor region is of n-type and the second semiconductor region is of p-type.

12. A semiconductor device according to claim 8, wherein the aperture has a width between 2 and 7 micrometers.

13. A semiconductor device according to claim 8, wherein the semiconductor layer is made of p-type silicon, the first semiconductor region is made of n-type silicon, the second semiconductor region is of p-type silicon and the semiconductor buried region is made of n-type silicon.

14. A semiconductor device according to claim 8, further comprising CMOS transistors formed on the semiconductor layer of the first conductivity type,
the semiconductor device being able to perform a switching action.

15. A semiconductor device comprising:
a semiconductor layer of a first conductivity type;
a first semiconductor region of a second conductivity type provided selectively on the semiconductor layer;
a second semiconductor region of the first conductivity type provided selectively on the first semiconductor region;
a semiconductor buried region of the second conductivity type provided between the semiconductor layer and the first semiconductor region, the semiconductor buried region having an aperture;
a third semiconductor region of the second conductivity type provided on the semiconductor layer to surround the first semiconductor region and connected to the buried region;
a fourth semiconductor region of the first conductivity type provided selectively on the semiconductor layer;
a first main electrode provided on the third semiconductor region;
a second main electrode provided on the second semiconductor region; and
a common electrode provided on the fourth semiconductor region, a diode structure being constituted by the first and second semiconductor regions, one of which serves as a cathode region and the other of which serves as an anode region, and carriers accumulated in the first semiconductor region being allowed to pass through the aperture provided in the buried region of the second conductivity type and to be discharged through the semiconductor layer, the fourth semiconductor region, and the common electrode.

16. A semiconductor device according to claim 15, wherein the discharge of the carriers is developed when a bias voltage applied to the diode structure is turned off from forward to reverse.

17. A semiconductor device according to claim 15, wherein the first semiconductor region is of n-type and the second semiconductor region is of p-type.

18. A semiconductor device according to claim 15, wherein the aperture has a width between 2 and 7 micrometers.

19. A semiconductor device according to claim 15, wherein the semiconductor layer is made of p-type silicon, the first semiconductor region is made of n-type silicon, the second semiconductor region is of p-type silicon and the semiconductor buried region is made of n-type silicon.

20. A semiconductor device according to claim 15, further comprising CMOS transistors formed on the semiconductor layer of the first conductivity type, the semiconductor device being able to perform a switching action.

* * * * *